United States Patent [19]

Gaibotti

[11] Patent Number: 4,752,702
[45] Date of Patent: Jun. 21, 1988

[54] BOOTSTRAP PILOT CIRCUIT IN N-MOS TECHNOLOGY FOR CAPACITIVE LOADS

[75] Inventor: Maurizio Gaibotti, Barlassina, Italy

[73] Assignee: SGS Microelettronica S.p.A., Catania, Italy

[21] Appl. No.: 891,347

[22] Filed: Jul. 31, 1986

[30] Foreign Application Priority Data

Aug. 2, 1985 [IT] Italy ................ 21846 A/85

[51] Int. Cl.[4] ............... H03K 17/687; H03K 19/082; H03F 1/00
[52] U.S. Cl. .................... 307/578; 307/482; 307/270; 330/156
[58] Field of Search ............... 307/482, 578, 263, 270; 330/156

[56] References Cited

U.S. PATENT DOCUMENTS 4,284,905  8/1981  Rosenzweig ............... 307/270
4,443,715  4/1984  Fox ............................ 307/578

Primary Examiner—Stanley D. Miller
Assistant Examiner—B. P. Davis
Attorney, Agent, or Firm—Cushman, Darby & Cushman

[57] ABSTRACT

A bootstrap condenser connected to the output of the circuit is preloaded during the low output state when the load transistor is off and the drive transistor is normally on. A commutation signal brings about extinction of the drive transistor and connection of the condenser to the gate of the load transistor to turn on the latter and secure the resulting rise of the circuit output. Transistors of the pilot circuit are arranged for maximum bootstrap efficiency.

4 Claims, 1 Drawing Sheet

BOOTSTRAP PILOT CIRCUIT IN N-MOS TECHNOLOGY FOR CAPACITIVE LOADS

BACKGROUND OF THE INVENTION

1. Field of the Invention

The present invention relates to a bootstrap pilot circuit in N-MOS technology for capacitive loads.

2. The Prior Art

A bootstrap circuit is known to be a circuit capable of bringing about an oversupply of the gate of the load transistor for a high conduction of said transistor.

Due to the effect of these characteristics the use of bootstrap circuits is frequent in N-MOS technology when it is desired to pilot with short response time a capacitive load of considerable value. The high conduction of the load transistor developed with the bootstrap circuit makes it possible to have rapid commutation of the output from low to high level.

A typical bootstrap circuit calls for separate piloting (but made appropriately sequential) of a load transistor and of a drive transistor in series and the interposition of a bootstrap condenser between the gate of the load transistor and the output, coinciding with an intermediate point between the two transistors.

With the drive transistor on and the load transistor off a pilot signal is first sent to the load transistor gate, which goes on, bringing about a simultaneous conduction condition of the two transistors. The same signal brings about loading of the bootstrap condenser, which holds the load transistor gate high. A second pilot signal is then sent to the drive transistor gate, which turns off, allowing the load transistor to make the output level rise and thus bring the load transistor gate higher due to its superconduction.

This known circuit has several drawbacks which can be summarized as (a) strong absorption of current between one pilot signal and the next due to the simultaneous conduction effect of the two transistors, (b) the need to oversize the drive transistor to obtain in the abovesaid phase as well as a good output voltage at low level, and (c) sequential piloting of two inputs with the resulting signal timing problems, in general by the use of delay lines which can be rather complex and cumbersome.

SUMMARY OF THE INVENTION

Considering this, the object of the present invention is to accomplish a pilot circuit equipped with a bootstrap conceived in such a manner as to achieve the objective of rapid commutation of the output while remaining free of the above drawbacks.

In accordance with the invention said object has been achieved by means of a pilot circuit with bootstrap comprising a load transistor and a normally on drive transistor connected in series between a supply and ground, a pilot input connected to the drive transistor gate in such a manner as to bring about extinction in response to a pilot signal applied to said input, a bootstrap condenser, and an output connected to a node intermediate between said transistors, characterized in that said bootstrap condenser is interposed between the circuit output and a circuit node controlled by said pilot signal in such a manner as to be commutable from a condition of normal operational connection to the circuit supply to a condition of operational conection to the gate of the load transistor to turn on the latter with bootstrap effect.

With this arrangement current consumption is minimal because the load and drive transistors are never in conduction at the same time. This obviates any need for oversizing the drive transistor to obtain a good output voltage at low level.

In addition there is only one pilot signal so that there are no longer any problems of timing as found with the known arrangement.

BRIEF DESCRIPTION OF THE DRAWINGS

The features of the present invention will be made clearer by the following detailed description of some practical embodiments thereof illustrated as examples in the annexed drawings in which.

DETAILED DESCRIPTION OF THE PREFERRED EMBODIMENT

Figure 1:
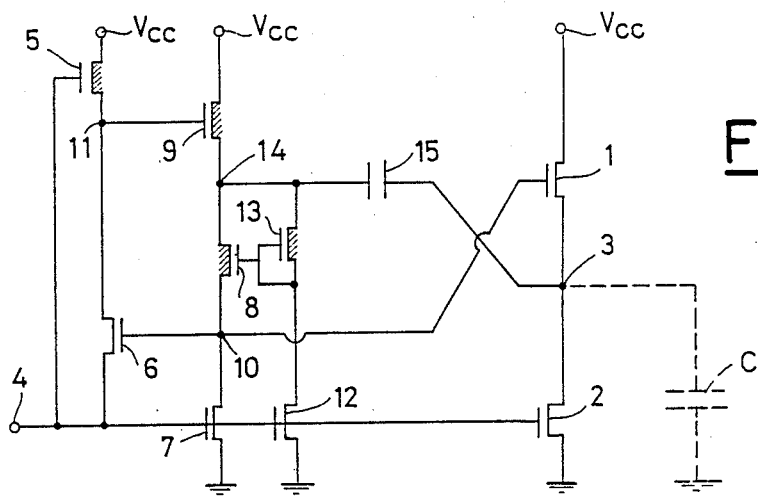
FIG. 1 shows an example of accomplishment of the pilot circuit with bootstrap in accordance with the invention.

With reference to FIG. 1 there is illustrated a pilot circuit including a load transistor 1 of the enhancement type, the natural type or the depletion type and a drive transistor 2 of the enhancement type connected in series between a positive supply $V_{cc}$ and ground. A node 3 intermediate between the transistors 1 and 2 constitutes the circuit output to which is applied the capacitive load C under control.

A pilot input 4 suppliable with a pilot signal for commutation of the output 3 from a normal low level to the high level suitable for piloting the capacitive load C is connected to the gate of the drive transistor 2.

Said input 4 is also connected to the gate of a depletion transistor 5 connected in series with an enhancement transistor 6 between a supply $V_{cc}$ and the input 4.

Again the input 4 is connected to the gate of an enhancement transistor 7 inserted in series with two depletion transistors 8 and 9 between a supply $V_{cc}$ and ground. A circuit node 10 intermediate between the transistors 7 and 8 is connected to the gate of the transistor 6 and to the gate of the load transistor 1. The gate of the transistor 9 is in turn connected to a circuit node 11 intermediate between the transistors 5 and 6.

The input 4 is finally connected to the gate of an enhancement transistor 12 which together with a depletion transistor 13 is connected in parallel to the transistors 7 and 8 between a circuit node 14 and earth. The gate of the transistor 13 is connected to its own source and to the gate of the transistor 8.

A bootstrap condenser 15 is finally interposed between the output 3 of the circuit and the circuit node 14. The condenser 15 is thus connected to the gate of the load transistor 1 through the depletion transistor 8, i.e. through a circuit element controlled in accordance with the known art instead of directly.

When at rest the signal at the pilot input 4 is at high level and the enhancement transistors 2, 7 and 12 are therefor on, i.e. they conduct current. The circuit node 10 is thus low and keeps the transistor 6 extinguished. The transistor 5 is on together with the transistor 9 which is strongly on and has a load the transistor 8 and 13, both at low conduction because their gate and source are low and the drain is connected to the node 14 (configuration with current generator). The transistor 9 has to be sized in such a manner that the voltage drop in the node 14 in relation to the supply voltage $V_{cc}$ is not excessively high since said drop results in a loss of efficiency.

Since the node 10 is low the load transistor 1 has its gate grounded so that it is in a minimum current condition. Then if the transistor 1 is of the enhancement type the current absorption in the output branch 1, 2 is null and the only absorption in the entire circuit is given by the transistors 8 and 13.

Under these conditions, i.e. with the transistor 2 on and the transistor 1 in weak or null conduction the output 3 is low and the bootstrap condenser 15 which is interposed between said low output and the high node 14, is preloaded at the voltage of the node 14, which is just below $V_{cc}$.

Upon arrival of a low level pilot signal at the piloting input 4 the transistors 2, 7 and 12 go off and the transistor 8 through the transistor 13 still in conduction has its gate connected to the drain (node 14). The transistor 8 is thus in strong conduction, i.e. in the best condition to describe a low-resistance path for rapid transfer of loads from the condenser 15 to the gate of the load transistor 1. That is, the condenser 15 is connected in parallel between the output 3 and the gate of the transistor 1, i.e. between the source and the gate of the transistor 1.

This operation must take place necessarily with time constant lower than the rise time of the output 3 if it is desired to avoid its becoming a limiting factor.

The transistor 6 being still momentarily extinguished ensures that the gate of the transistor 9 is brought to ground only when there is occurring transfer of loads from the condenser 15 to the transistor 1 preventing, during commutation, discharge, even though partial, of the condenser 15 due to the effect of the transistors 8 and 13 which are no longer supported due to extinction of the transistor 9.

In this manner the efficiency of the bootstrap function no longer depends strongly on the commutation time of the input signal although it should be remembered that an excessively loose commutation front of the input signal would tend to not justify use of the bootstrap circuit to speed up commutation.

Returning to the operation of the circuit of FIG. 1 the described connection of the bootstrap condenser 15 to the gate of the load transistor 1 turns on the transistor 1 which begins to take the output 3 high. As said output 3 rises so does the voltage of the circuit node 14 which, not finding discharge paths, can go above the supply voltage $V_{cc}$. Once the paths constituted by the transistors 7 and 12, which are safety extinguished, are excluded there can also be excluded the path constituted by the transistor 9 since having drain at the voltage $V_{cc}$ and gate to ground (node 11) the transistor 9 is extinguished by source voltage (node 14) higher than the Pinch voltage (negative gate voltage which would extinguish the transistor), a condition usually respected in the characteristics typical of the load transistor used in N-MOS technology.

With the described diagram there can readily be obtained bootstrap efficiencies over 70% thus making easy the use of an enhancement transistor as the load transistor 1. In this manner as already mentioned the load transistor normally does not conduct so that there is maximum efficiency in terms of consumption of the output branch 1, 2. Good efficiency is obtainable in any case by utilizing as a load transistor even natural or slightly depleted transistors.

Upon increase of implantation of the transistor 1, the more the absolute Pinch voltage value of said transistor approaches the supply voltage and the less efficient the system will become in terms of performance/consumption.

It should be noted that employment of the circuit diagram of FIG. 1 is amply justified for high capacitive loads (a few dozen picofarad).

Figure 2:
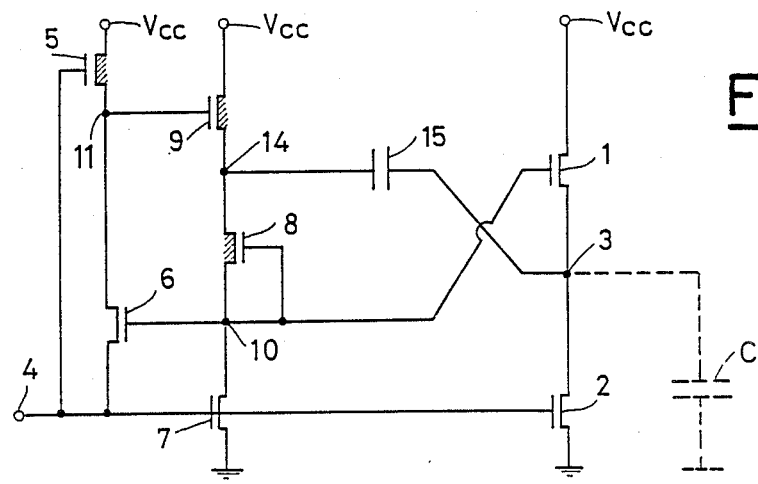
FIG. 2 shows a variant of the above circuit.

For lower output loads (up to 10 picofarad) it may be profitable, if there are surface area saving problems, to use a simpler diagram such as the one shown in FIG. 2 which does not have the transistors 13 and 12 and the related circuit branch and has the gate of the transistor 8 connected to the node 10.

Figure 3:
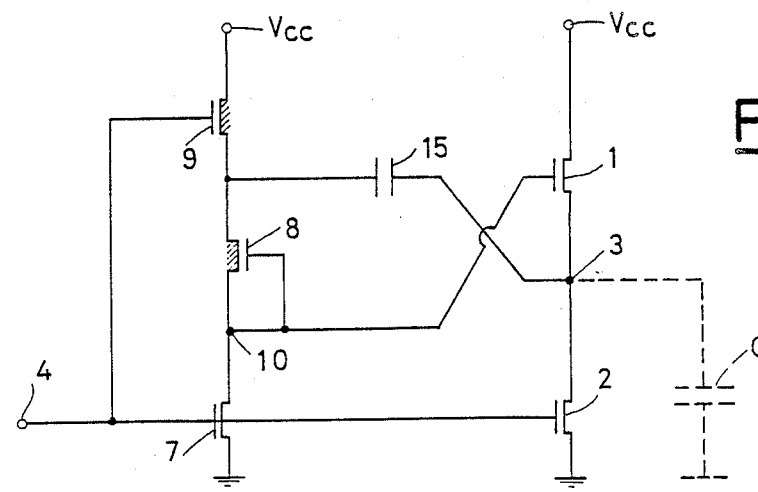
FIG. 3 shows another variant of the circuit of FIG. 1.

If the commutation front of the input signal from high to low is extremely fast and there is no concern for a small loss of bootstrap efficiency, there may be used the diagram of FIG. 3 which likewise does not have the transistors 5 and 6 and the related circuit branch and has the gate of the transistor 9 connected directly to the input 4.

I claim:

1. Pilot circuit with bootstrap in N-MOS technology for capacitive loads comprising:
   a load transistor;
   a normally on drive transistor connected in series with said load transistor between a supply and ground;
   a pilot input connected to a gate of the drive transistor in such a manner as to bring about extinction thereof in response to a pilot signal applied to said input;
   an output connected between said load and drive transistors;
   a bootstrap condenser interposed between the circuit output and a circuit node;
   a first normally on transistor connected between said circuit node and said supply;
   a second transistor connected between said circuit node and a gate of said load transistor and said second transistor being commanded to conduct by said pilot signal;
   a third transistor being of the normally on type and having a gate connected to said pilot input;
   a fourth transistor connected in series with said third transistor between the supply of the circuit and the pilot input, a gate of said first transistor being connected to a junction between said third and fourth transistors, said fourth transistor being the normally off type and having a gate connected to said gate of said load transistor.

2. A circuit according to claim 1 wherein said load transistor, said drive transistor and said fourth transistor are enhancement mode N-MOS transistors and said first, second and third transistors are depletion mode transistors.

3. Circuit in accordance with claim 1 wherein said second transistor is a normally on transistor held in low conduction in the absence of a pilot signal and commuted in high conduction by said pilot signal.

4. Circuit in accordance with claim 3 wherein said second transistor has a drain terminal connected to said circuit node and source and gate terminals connected to ground through at least a fifth transistor kept on in the absence of a pilot signal and commanded to go off by said pilot signal.

* * * * *